United States Patent
Alfieri

(10) Patent No.: US 9,015,643 B2
(45) Date of Patent: Apr. 21, 2015

(54) SYSTEM, METHOD, AND COMPUTER PROGRAM PRODUCT FOR APPLYING A CALLBACK FUNCTION TO DATA VALUES

(71) Applicant: NVIDIA Corporation, Santa Clara, CA (US)

(72) Inventor: Robert Anthony Alfieri, Chapel Hill, NC (US)

(73) Assignee: NVIDIA Corporation, Santa Clara, CA (US)

(*) Notice: Subject to any disclaimer, the term of this patent is extended or adjusted under 35 U.S.C. 154(b) by 0 days.

(21) Appl. No.: 13/844,437

(22) Filed: Mar. 15, 2013

(65) Prior Publication Data

US 2014/0282313 A1 Sep. 18, 2014

(51) Int. Cl.
*G06F 17/50* (2006.01)

(52) U.S. Cl.
CPC ........ *G06F 17/5045* (2013.01); *G06F 17/5036* (2013.01); *G06F 17/5022* (2013.01)

(58) Field of Classification Search
CPC .................................. G06F 17/5022
USPC ................. 716/103, 104, 106, 111, 113, 136; 703/13, 14, 16
See application file for complete search history.

(56) References Cited

U.S. PATENT DOCUMENTS

| | | | |
|---|---|---|---|
| 5,991,771 A * | 11/1999 | Falls et al. ............................. 1/1 |
| 6,044,394 A | 3/2000 | Cadden et al. |
| 6,106,575 A | 8/2000 | Hardwick |
| 6,110,218 A | 8/2000 | Jennings |
| 6,151,618 A | 11/2000 | Wahbe et al. |
| 6,192,365 B1 * | 2/2001 | Draper et al. ................. 707/648 |
| 6,344,852 B1 * | 2/2002 | Zhu et al. ...................... 345/418 |
| 6,360,191 B1 * | 3/2002 | Koza et al. ......................... 703/6 |
| 6,393,386 B1 * | 5/2002 | Zager et al. ..................... 703/25 |
| 6,421,808 B1 | 7/2002 | McGeer et al. |
| 6,611,952 B1 | 8/2003 | Prakash et al. |
| 6,625,797 B1 | 9/2003 | Edwards et al. |
| 6,691,301 B2 * | 2/2004 | Bowen .......................... 717/114 |
| 6,745,384 B1 | 6/2004 | Biggerstaff |
| 6,836,877 B1 | 12/2004 | Dupenloup |
| 6,876,362 B1 * | 4/2005 | Newhall et al. ............... 345/426 |
| 6,990,438 B1 * | 1/2006 | Chowdhury et al. ........... 703/13 |
| 7,007,261 B1 | 2/2006 | Ballagh et al. |
| 7,024,660 B2 | 4/2006 | Andrade et al. |
| 7,058,562 B2 * | 6/2006 | Powell ............................ 703/22 |
| 7,143,387 B2 | 11/2006 | Fields, Jr. et al. |
| 7,159,183 B1 | 1/2007 | Kudukoli et al. |
| 7,181,714 B2 * | 2/2007 | Imai .............................. 716/105 |
| 7,240,335 B2 * | 7/2007 | Angel et al. ................... 717/130 |
| 7,313,773 B1 * | 12/2007 | Braun et al. .................. 716/103 |
| 7,343,594 B1 * | 3/2008 | Metzgen ....................... 717/140 |
| 7,363,610 B2 | 4/2008 | Alfieri |
| 7,383,529 B2 | 6/2008 | Gupta et al. |

(Continued)

OTHER PUBLICATIONS

U.S. Appl. No. 13/844,330, filed Mar. 15, 2013.

(Continued)

*Primary Examiner* — Helen Rossoshek

(74) *Attorney, Agent, or Firm* — Zilka-Kotab, PC

(57) ABSTRACT

A system, method, and computer program product are provided for applying a callback function to data values. In use, a plurality of data values and a callback function are identified. Additionally, the callback function is recursively applied to the plurality of data values in order to determine a result. Further, the result is returned.

19 Claims, 4 Drawing Sheets

(56) References Cited

U.S. PATENT DOCUMENTS

| | | | |
|---|---|---|---|
| 7,395,358 B2* | 7/2008 | Mills et al. | 710/5 |
| 7,433,813 B1* | 10/2008 | Ballagh et al. | 703/16 |
| 7,472,055 B2* | 12/2008 | Garcia et al. | 703/25 |
| 7,483,823 B2 | 1/2009 | Alfieri | |
| 7,577,707 B2* | 8/2009 | Hufferd et al. | 709/206 |
| 7,581,201 B2* | 8/2009 | Kazda et al. | 716/113 |
| 7,743,370 B1 | 6/2010 | Krablin et al. | |
| 7,802,147 B1* | 9/2010 | Johnson et al. | 714/41 |
| 7,827,510 B1* | 11/2010 | Schubert et al. | 716/136 |
| 8,117,574 B2* | 2/2012 | Deutschle et al. | 716/106 |
| 8,141,059 B2* | 3/2012 | Ding et al. | 717/133 |
| 8,180,943 B1* | 5/2012 | Priem | 710/262 |
| 8,219,974 B2* | 7/2012 | Schmidt | 717/120 |
| 8,458,630 B1* | 6/2013 | Van Canpenhout | 716/104 |
| 8,463,589 B2* | 6/2013 | Clark et al. | 703/22 |
| 8,464,217 B2* | 6/2013 | Janczewski | 717/116 |
| 8,468,335 B2 | 6/2013 | Lin et al. | |
| 8,473,897 B2* | 6/2013 | Box et al. | 717/106 |
| 8,558,839 B1* | 10/2013 | Wyatt | 345/502 |
| 8,561,176 B1* | 10/2013 | Dalcher | 726/22 |
| 8,648,856 B2* | 2/2014 | Newhall et al. | 345/426 |
| 8,776,030 B2* | 7/2014 | Grover et al. | 717/137 |
| 8,839,163 B2* | 9/2014 | Ootsubo | 716/104 |
| 8,930,861 B2 | 1/2015 | Alfieri | |
| 2001/0034876 A1 | 10/2001 | Panchul et al. | |
| 2002/0019969 A1* | 2/2002 | Hellestrand et al. | 716/5 |
| 2002/0133369 A1 | 9/2002 | Johnson | |
| 2003/0121010 A1* | 6/2003 | Aubury | 716/4 |
| 2004/0068640 A1 | 4/2004 | Jacobson et al. | |
| 2004/0225999 A1 | 11/2004 | Nuss | |
| 2004/0226006 A1 | 11/2004 | Russell | |
| 2005/0050509 A1 | 3/2005 | Fields et al. | |
| 2005/0144581 A1* | 6/2005 | Imai | 716/7 |
| 2006/0041872 A1 | 2/2006 | Poznanovic et al. | |
| 2006/0064655 A1* | 3/2006 | Horeth | 716/4 |
| 2006/0236226 A1 | 10/2006 | Meijer et al. | |
| 2007/0055966 A1* | 3/2007 | Waddington et al. | 717/144 |
| 2007/0219771 A1 | 9/2007 | Verheyen et al. | |
| 2007/0294647 A1 | 12/2007 | Fong et al. | |
| 2008/0270438 A1 | 10/2008 | Aronson et al. | |
| 2010/0088666 A1* | 4/2010 | Box et al. | 717/104 |
| 2010/0268979 A1 | 10/2010 | Johnson | |
| 2012/0311411 A1 | 12/2012 | Kirkpatrick | |
| 2012/0324408 A1 | 12/2012 | Shacham et al. | |
| 2013/0014095 A1* | 1/2013 | Metzgen | 717/149 |
| 2013/0019216 A1 | 1/2013 | Vasudevan et al. | |
| 2014/0278328 A1* | 9/2014 | Alfieri | 703/14 |
| 2014/0280412 A1* | 9/2014 | Alfieri | 708/250 |
| 2014/0282309 A1* | 9/2014 | Alfieri | 716/102 |
| 2014/0282382 A1 | 9/2014 | Alfieri | |
| 2014/0282390 A1* | 9/2014 | Alfieri | 717/115 |
| 2014/0310664 A1 | 10/2014 | Alfieri | |
| 2014/0310665 A1 | 10/2014 | Alfieri | |
| 2014/0310673 A1 | 10/2014 | Alfieri | |

OTHER PUBLICATIONS

U.S. Appl. No. 13/868,954, filed Apr. 23, 2013.
U.S. Appl. No. 13/844,374, filed Mar. 15, 2013.
U.S. Appl. No. 13/844,400, filed Mar. 15, 2013.
U.S. Appl. No. 13/844,477, filed Mar. 15, 2013.
U.S. Appl. No. 13/860,463, filed Apr. 10, 2013.
U.S. Appl. No. 13/860,472, filed Apr. 10, 2013.
U.S. Appl. No. 13/860,480, filed Apr. 10, 2013.
Non-Final Office Action from U.S. Appl. No. 13/868,954, dated May 13, 2014.
Non-Final Office Action from U.S. Appl. No. 13/860,463, dated Feb. 27, 2014.
Notice of Allowance from U.S. Appl. No. 13/860,472, dated May 21, 2014.
Non-Final Office Action from U.S. Appl. No. 13/860,480, dated May 13, 2014.
De Rauglaudre, D., "Camlp4—Tutorial," version 3.07, Sep. 30, 2003, http://caml.inria.fr/pub/docs/tutorial-camlp4/index.html.
Notice of Allowance from U.S. Appl. No. 13/868,954, dated Aug. 22, 2014.
Non-Final Office Action from U.S. Appl. No. 13/844,477, dated Sep. 11, 2014.
Notice of Allowance from U.S. Appl. No. 13/860,463, dated Aug. 26, 2014.
Notice of Allowance from U.S. Appl. No. 13/860,472, dated Sep. 4, 2014.
Final Office Action from U.S. Appl. No. 13/860,480, dated Aug. 21, 2014.
Notice of Allowance from U.S. Appl. No. 13/860,472, dated Jan. 15, 2015.
Non-Final Office Action from U.S. Appl. No. 13/844,374, dated Nov. 19, 2014.
Notice of Allowance from U.S. Appl. No. 13/860,463, dated Jan. 27, 2015.
Non-Final Office Action from U.S. Appl. No. 13/860,480, dated Mar. 6, 2015.

* cited by examiner

SYSTEM, METHOD, AND COMPUTER PROGRAM PRODUCT FOR APPLYING A CALLBACK FUNCTION TO DATA VALUES

FIELD OF THE INVENTION

The present invention relates to hardware designs, and more particularly to hardware design components and their implementation.

BACKGROUND

Hardware design and verification are important aspects of the hardware creation process. For example, a hardware description language may be used to model and verify circuit designs. However, current techniques for designing hardware have been associated with various limitations.

For example, many elements of current hardware design may involve logic that addresses a single specific case. This specific logic may be difficult to produce and analyze. There is thus a need for addressing these and/or other issues associated with the prior art.

SUMMARY

A system, method, and computer program product are provided for applying a callback function to data values. In use, a plurality of data values and a callback function are identified. Additionally, the callback function is recursively applied to the plurality of data values in order to determine a result. Further, the result is returned.

DETAILED DESCRIPTION

Figure 1:
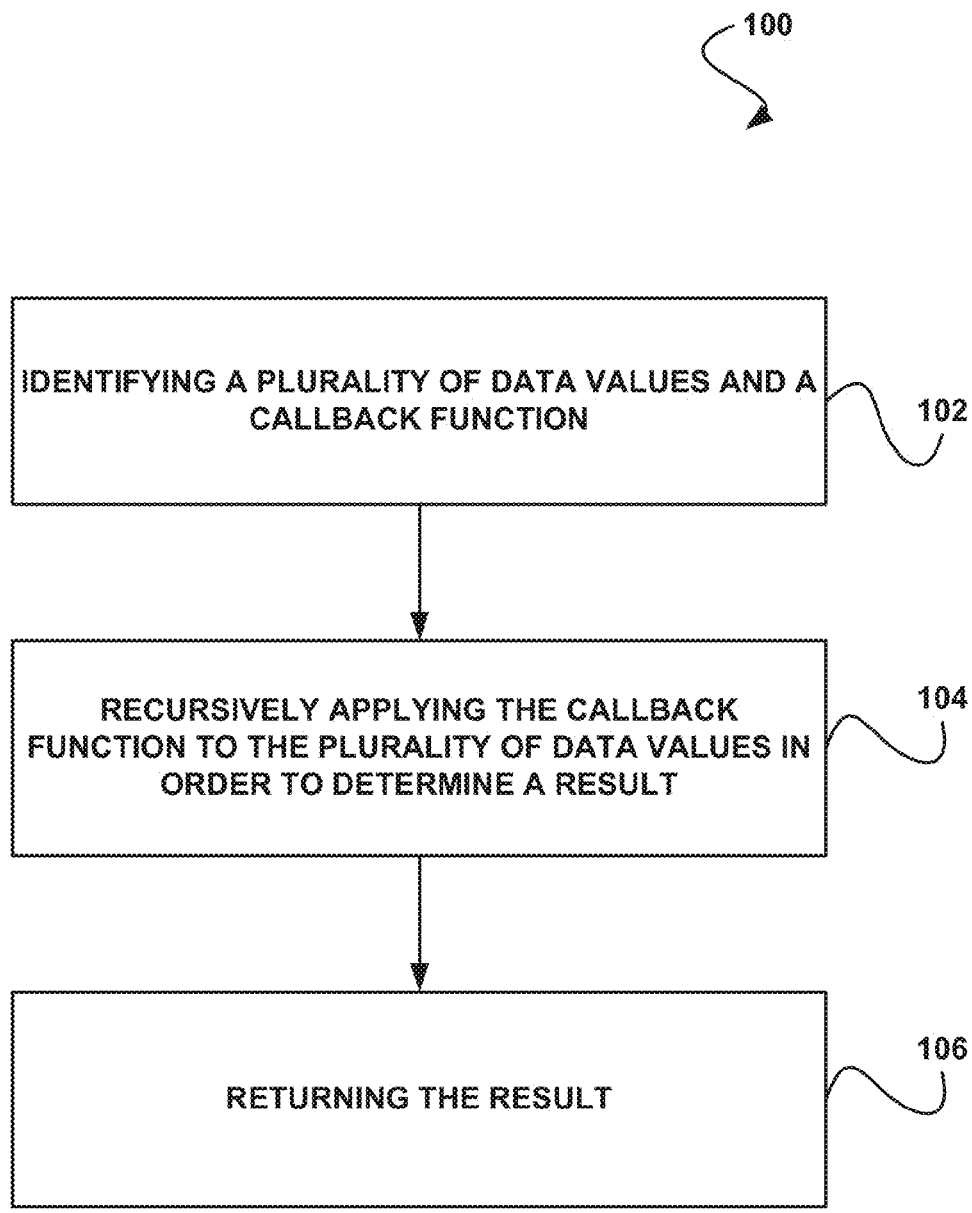
FIG. 1 shows a method for applying a callback function to data values, in accordance with one embodiment.

FIG. 1 shows a method 100 for applying a callback function to data values, in accordance with one embodiment. As shown in operation 102, a plurality of data values and a callback function are identified. In one embodiment, each of the plurality of data values may include a data flow. For example, the plurality of data values may include subflows within a numerical hierarchy data flow (e.g., a hierarchical data flow containing a plurality of subflows, etc.). In another embodiment, each data flow may represent a flow of data through a hardware design.

In another embodiment, each data flow may include one or more groups of signals. For example, each data flow may include one or more groups of signals including implicit flow control signals. In yet another embodiment, each data flow may be associated with one or more interfaces. For example, each data flow may be associated with one or more interfaces of a hardware design. In still another embodiment, the plurality of data values and the callback function may be passed as parameters of a function.

Additionally, in one embodiment, each of the plurality of data values may include a bit value. For example, each of the plurality of data values may be included as bits within a leaf data flow (e.g., a data flow containing raw bits, etc.). In another embodiment, the callback function may include a subroutine reference (e.g., a reference within a code block to a subroutine, etc.). In yet another embodiment, the callback function may be able to perform one or more operations on the plurality of data values. In yet another embodiment, the plurality of data values and the callback function may be received from a user. For example, the user may identify the data values and the callback function as parameters to a function call.

Further, in one embodiment, as shown in operation 104, the callback function is recursively applied to the plurality of data values in order to determine a result. In one embodiment, applying the callback function to the plurality of data values may include performing a reduction operation on the plurality of data values. In another embodiment, applying the callback function to the plurality of data values may include identifying each of the plurality of data values as leaf nodes of a tree-based data structure (e.g., a simulation of a hierarchical tree structure including a set of linked nodes, etc.). For example, the tree-based data structure may be created, and each of the plurality of data values may be assigned as leaf nodes (e.g., nodes without children) of the tree-based data structure. In yet another embodiment, applying the callback function to the plurality of data values may include identifying one or more levels of the tree-based data structure.

Further still, in one embodiment, applying the callback function to the plurality of data values may include recursively performing one or more leaf node comparisons. For example, applying the callback function to the plurality of data values may include performing a first round of comparisons. For instance, the first round of comparisons may include a plurality of comparisons. Additionally, each comparison may be made between two or more unique data values by the callback function.

Also, in one embodiment, performing the first round of comparisons may result in one or more outputs. For example, each comparison performed by the callback function may produce an output. In one embodiment, the output may include an indication of a data value. In another embodiment, the output may include a plurality of information elements (e.g., data associated with the comparison, node identification, result information, etc.). In yet another embodiment, the output may be returned as a data structure (e.g., a hash, etc.).

In addition, in one embodiment, the first round of comparisons may be performed at a first level of the tree-based data structure (e.g., the lowest level of the tree, travelling from children to parent, etc.). In another embodiment, applying the callback function to the plurality of data values may include performing a second round of comparisons, utilizing the callback function. For example, the second round of comparisons may include a plurality of comparisons. For instance, each comparison of the second round of comparisons may include a comparison of two or more outputs resulting from the first round of comparisons.

Furthermore, in one embodiment, performing the second round of comparisons may result in one or more outputs. For example, each comparison performed by the callback function may again produce an output. In another embodiment, the second round of comparisons may be performed at a second level of the tree-based data structure (e.g., the next highest level of the tree, etc.).

Further still, in one embodiment, consecutive rounds of comparisons may be performed by the callback function at each level of the tree-based structure until a single output is produced for a particular round of comparisons. In another embodiment, the result may include the single output. In yet another embodiment, the recursive application of the callback function to the plurality of data values may be done using logN levels of logic. In this way, the recursive application may be performed in one hardware cycle.

Also, as shown in operation 106, the result is returned. In one embodiment, the result may include a hash of information. For example, the result may include a hash of per-node information, a hash of multiple pieces of information about each partial result during each round of comparisons, etc. In another embodiment, the result may be stored (e.g., in a database, in memory, etc.). In yet another embodiment, the result may be provided to a function (e.g., a function that passed the plurality of data values and the callback function, etc.), to a user, etc.

Additionally, in one embodiment, applying the callback function to the plurality of data values may be performed by a function (e.g., a function that is passed the plurality of data values and the callback function, etc.), utilizing a processor. In another embodiment, the function may include a tree function. In yet another embodiment, the tree function may be included within a compute construct. For example, the compute construct may include an entity (e.g., a module, etc.), implemented as part of a hardware description language, that receives one or more data flows as input and creates one or more output data flows, based on the one or more input data flows.

Further, in one embodiment, the tree function may be utilized by another function. For example, the tree function may be utilized by a Min( ) function that returns a minimum value from a hierarchical data flow with multiple numerically named subflows. In another example, the tree function may be utilized by a Max( ) function that returns a maximum value from a hierarchical data flow with multiple numerically named subflows. In yet another example, the tree function may be utilized by a Prio_Min( ) function that returns a minimum priority value from a numerical hierarchy data flow containing priority values. In still another example, the tree function may be utilized by a Prio_Max( ) function that returns a maximum priority value from a numerical hierarchy data flow containing priority values.

Further still, in one embodiment, the tree function may be utilized by a scatter-gather function. In another embodiment, the other function utilizing the tree function may be included within a compute construct. In this way, the tree function may provide an organized framework for enabling tree-structured combinatorial algorithms and associated functions.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
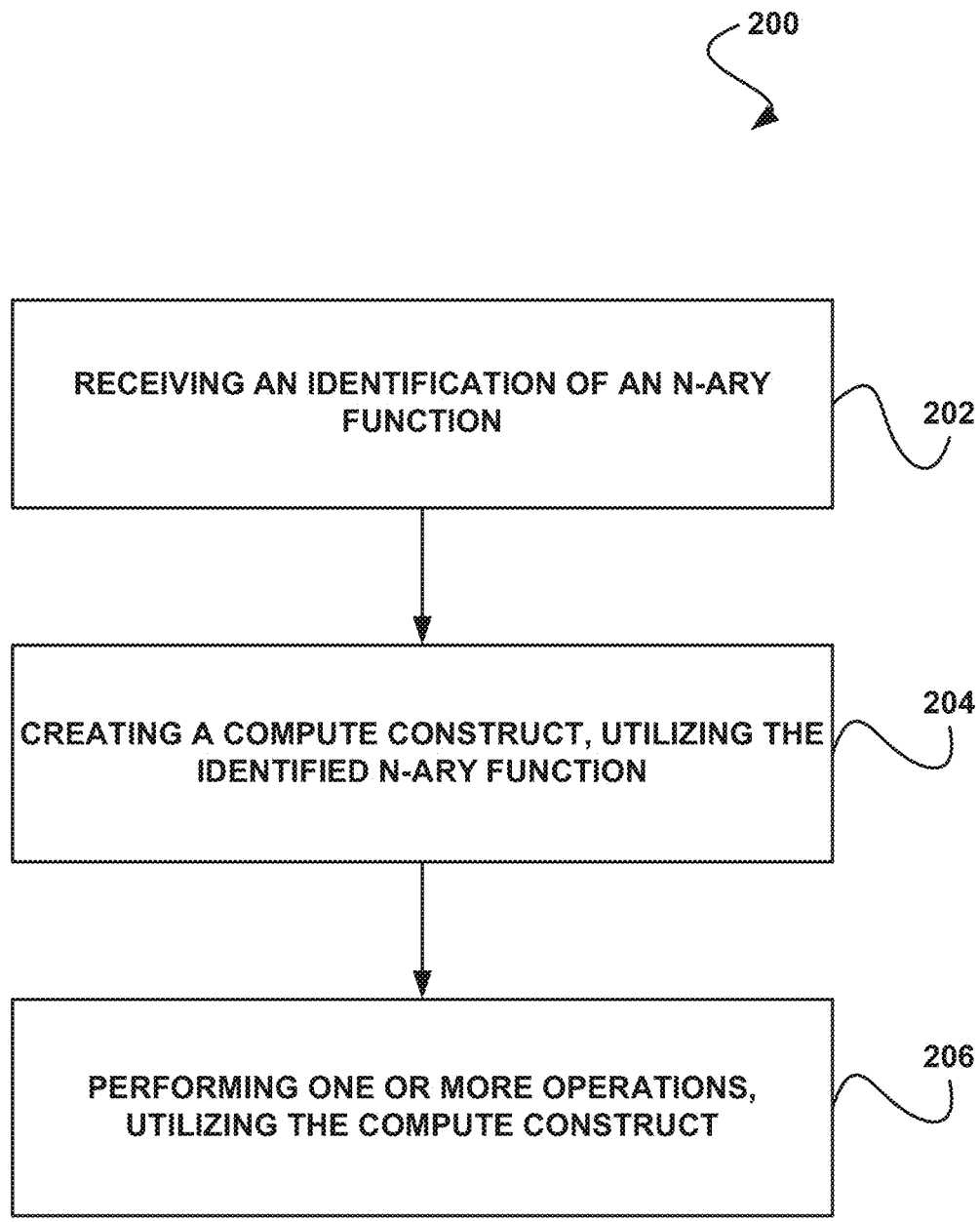
FIG. 2 shows a method for creating a compute construct, utilizing an N-ary function, in accordance with another embodiment.

FIG. 2 shows a method 200 for creating a compute construct, utilizing an N-ary function, in accordance with one embodiment. As an option, the method 200 may be carried out in the context of the functionality of FIG. 1. Of course, however, the method 200 may be implemented in any desired environment. It should also be noted that the aforementioned definitions may apply during the present description.

As shown in operation 202, an identification of an N-ary function is received. In one embodiment, the N-ary function may include a function that has N significant conditions, where N is a positive integer greater than one. In another embodiment, the identification of the N-ary function may be performed by a user, utilizing a code block. For example, the identified N-ary function may be called within a general purpose code block, where such code block may include hardware design statements mixed with scripting language statements.

Additionally, in one embodiment, the identified N-ary function may be input by the user into a subroutine of a programming language used to draft code associated with the compute construct. In still another embodiment, the N-ary function may be created and stored, and the identification of the N-ary function may include a reference to the stored N-ary function.

Further, in one embodiment, the identified N-ary function may include code that is implemented in hardware-time or simulation-time. In another embodiment, the identified N-ary function may be received in association with standard scripting language code. For example, the identified N-ary function may be included within one or more hardware code components that are interspersed with one or more standard scripting language statements (e.g., Perl statements, etc.).

Further still, as shown in operation 204, a compute construct is created, utilizing the identified N-ary function. In one embodiment, the code block provided by the user containing the identification of the N-ary function may be used to create the control construct, such that the compute construct includes the N-ary function. In another embodiment, the compute construct may include an entity (e.g., a module, etc.), implemented as part of a hardware description language, that receives one or more data flows as input, where each data flow may represent a flow of data.

For example, each data flow may represent a flow of data through a hardware design. In another embodiment, each data flow may include one or more groups of signals. For example, each data flow may include one or more groups of signals including implicit flow control signals. In yet another embodiment, each data flow may be associated with one or more interfaces. For example, each data flow may be associated with one or more interfaces of a hardware design. See, for example, U.S. patent application Ser. No. 13/844,374, filed Mar. 15, 2013, which is hereby incorporated by reference in its entirety, and which describes examples of creating a compute construct.

Also, as shown in operation 206, one or more operations are performed, utilizing the compute construct. In one embodiment, one or more activated data flows may be received by the compute construct, and one or more output data flows may be output from the compute construct. In another embodiment, the N-ary function may include a tree-based logN combinational function. For example, the N-ary function may include a tree function (e.g., Tree( ), etc.) that performs a bottom-up, recursive traversal of data at build-time. For example, a numerical hierarchical data flow with N subflows named 0 . . . N–1 may be passed to the tree function, where each subflow may form the leaves of the tree. In another example, a leaf data flow (e.g., raw bits, etc.) may be passed to the tree function, in which case the individual bits may be treated as the leaves of the tree.

Further, in one embodiment, a callback function may also be passed to the tree function. For example, for each node in the tree of logic, the tree function may call the callback function. In another embodiment, the tree may be binary, but an optional argument may be passed to the tree function that specifies a different N-ary-ness, (e.g., 3, 4, etc.). This may be used by the tree function to group nodes in each callback.

In one example, N-ary may equal 2. Additionally, in the first iteration, each callback instance of the callback function may be passed these arguments: the current level in the tree (0 for first iteration), the starting leaf index in the original data flow (0, 2, 4, etc.), the number of original leaves covered by the call (2 for level 0), and up to 2 outputs from the previous level of the tree (which will be the leaves for level 0). In one embodiment, if the original data flow does not have an even number of leaves, then the last callback may not cover 2 leaves.

Further still, within the tree function, during the next iteration (e.g., the next level up, level 1), a callback may be made with starting leaf index 0 and count 4, then with starting index 4 and count 4, etc. Additionally, the return values from each pair of adjacent callbacks from level 0 may be passed as arguments for this level 1 callback. The final iteration may be performed at the final level (e.g., level log2(N)−1) which may contain one callback with 2 lower-level inputs and which may produce the final output. In another embodiment, a user may control the return value of the callback. For example, the return value may be a data flow, a hash of multiple pieces of information about each partial iteration result a hash of per-node iteration information, etc.

Also, in one embodiment, starting with the leaf level which is deemed level 0, the callback function may be called with these arguments: the current tree level, the starting leaf index in the original input data flow, the number of original leaves covered by this call, and up to "N-ary" outputs from the previous stage in the tree. For the first-level calls to the callback function, up to "N-ary" leaf subflows may be passed as the inputs. The callback function may then return a single scalar entity. For the second-level calls to the callback function, the inputs may be the return values from the first-level callbacks, and the tree function may complete when it has only one callback return value left to work on, which may be returned as the result.

Additionally, in one embodiment, the N-ary function may include a function that utilizes the tree function. For example, the N-ary function may include a minimum function (e.g., Min( )) that receives a hierarchical data flow with multiple numerically named subflows and returns the minimum value using the tree function. In another example, the N-ary function may include a maximum function (e.g., Max( )) that receives a hierarchical data flow with multiple numerically named subflows and returns the maximum value using the tree function.

Further, in one embodiment, the N-ary function may include a priority minimum function (e.g., Prio_Min( )) that receives a numerical hierarchy data flow containing priority values of any width, or a data flow that is a raw bitmask where each bit represents priority 0 or 1. The priority minimum function may also receive an argument representing the index of the subflow that should take precedence if there are ties in the priority values. The priority minimum function may use the tree function to find the minimum priority and may return the index of the subflow (leaf) holding that priority value.

Further still, in one embodiment, the N-ary function may include a priority maximum function (e.g., Prio_Max( )) that receives a numerical hierarchy data flow containing priority values of any width, or a data flow that is a raw bitmask where each bit represents priority 0 or 1. The priority maximum function may also receive an argument representing the index of the subflow that should take precedence if there are ties in the priority values. The priority maximum function may use the tree function to find the maximum priority and may return the index of the subflow (leaf) holding that priority value. In one embodiment, the priority minimum function and/or the priority maximum function may be used to construct a priority-based round-robin arbiter.

Also, in one embodiment, the N-ary function may include a scatter/gather function that utilizes the tree function. For example, the N-ary function may include a gathered function (e.g., Gathered( )) that receives a scattered data flow with N valid subflows and a corresponding sparse bitmask of valid indexes, then collapses the M valid subflows down into a data flow where contiguous indexes 0 . . . M−1 contain the data. In another example, the N-ary function may include a gathered indexes function (e.g., Gathered_indexes( )) that returns the actual gathered indexes as the resultant gathered data.

In addition, in one embodiment, the N-ary function may include a scattered index function (e.g., Scattered_Index( )) that receives a valid mask of scattered values and a gathered index, then returns the scattered index corresponding to what its gathered index would be. In another embodiment, the N-ary function may include a gathered index function (e.g., Gathered_index( )) that receives a valid mask of scattered values and a scattered index, and returns the gathered index corresponding to that scattered index.

Further, in one embodiment, the N-ary function may include a scatter/gather function that does not utilize the tree function. For example, the N-ary function may include a scattered function (e.g., Scattered( )) that receives a pair of associated data flows, one containing M subflows of data with indexes 0 . . . M−1; and another data flow containing the target scatter indexes of those data where the maximum index is N−1. The scattered function may then returns a data flow with N subflows holding the scattered data from the input data flow. For un-scattered indexes, the data may be undefined. In another embodiment, the scattered function may return a bitmask denoting which indexes in the scattered result are valid. In another example, the N-ary function may include a scattered indexes function (e.g., Scattered_Indexes( )) that calls the scattered function with the received indexes' data flow also as the data data flow. In this way, the indexes themselves may be scattered.

In another embodiment, the compute construct may be created utilizing one or more N-ary operators. Table 1 illustrates exemplary N-ary functions and operators that may be included within a compute construct, in accordance with one embodiment. The N-ary functions shown in Table 1 represent combinational functions that may be used within integrated circuit designs to perform arbitration and perform other operations. Of course, it should be noted that the exemplary options shown in Table 1 are set forth for illustrative purposes only, and thus should not be construed as limiting in any manner. Also, the N-ary functions and operators in Table 1 may not utilize a tree function.

TABLE 1

| Op | Example | Out Width | Description |
| --- | --- | --- | --- |
| {<>} | {<$Expr0,$Expr1,$Expr2>} | width0+width1+width2 | concatenation; each $Expr0 may be a hierarchical flow, but the final result is |

TABLE 1-continued

| Op | Example | Out Width | Description |
|---|---|---|---|
| | | | always a Uint( ) leaf. The "of" replication operator may be used, for example {< 3 of $Expr0 >}, and 'of' can be used outside of a concatenation, |
| Mux | $Sel->Mux( $Expr0, $Expr1, $Expr2, $Expr4 ) | max(width0, . . . ) | mux operator; $Sel must have width of log2(arg_count); if an expression is missing, its value is assumed to be 0 |
| Any | $Expr0->Any( $Expr1, $Expr2, $Expr3 ) | 1 | \|{< $Expr0 == $Expr1, $Expr0 == $Expr2, $Expr0 == $Expr3 >} |
| None | $Expr0->None( $Expr1, $Expr2, $Expr3 ) | 1 | &{< $Expr0 != $Expr1, $Expr0 != $Expr2, $Expr0 != $Expr3 >} |
| One | $Expr0->One( $Expr1, $Expr2, $Expr3 ) | 1 | {< $Expr0 == $Expr1, $Expr0 == $Exp2, $Expr0 == $Expr3 >} ->Is_One_Hot( ) |
| Wrapped_Add | $Expr0->Wrapped_Add( $Expr1, 5 ) | width0 | Computes $Expr0 + $Expr1. If the result is >= 5, subtracts 5 |
| Wrapped_Sub | $Expr0->Wrapped_Sub( $Expr1, 5 ) | width0 | Computes $Expr0 − $Expr1. If the result is < 0, adds 5 |
| Partial_product | $Expr0->Partial_product( $Expr1, $partial_prod_width) | 2*$partial_prod_width | Multiplies $Expr1 * $Expr1 and returns two carry-save partial products each with width $partial_prod_width. These are concatenated. These may be passed to a Wallace_Tree( ) below |
| Wallace_Tree | $Expr0->Wallace_Tree( $Expr1, $Expr2 ) | 2 * (max(width0, . . . ) + arg_count − 1) | Takes N arguments $Expr0, etc. and adds them together, producing two carry-save sums each large enough to hold the sum. These 2 outputs are each (max(width0, . . . ) + arg_count − 1) wide and are concatenated in the output. The two Partial_product( ) outputs and an additional addend may be passed to this call, each zero-extended to (max(width0, . . . ) + arg_count − 1) bits If an Expr is not a leaf, if may be expanded into its leaves. |
| Sum | $Expr0->Sum( $Expr1, $Expr2 ) | max(width0, . . . ) + arg_count − 1 | Same as Wallace_Tree, except produces one resolved sum. If an Expr is not a leaf, it will expand it into its leaves. |

TABLE 1-continued

| Op | Example | Out Width | Description |
|---|---|---|---|
| Min<br>Max | $Values->Min( )<br>$Values->Max( ) | $Values->{0}->width( ) | Returns the minimum/maximum of $Values, which must be a numeric hierarchy with leaves. Uses Tree( ) below. |
| Prio_Min<br>Prio_Max | $Values->Prio_Min( $Prio_Index )<br>$Values->Prio_Max( $Prio_Index ) | (log2($Values->name_count( )), $Values->{0}->width( )) | |
| Scattered | $Indexes->Scattered( $Values, $VId_Count, $max_count ) | ($max_count*$Values->{0}->width( ), $max_count) | Takes a numeric hierarchy flow $Indexes with at least $VId_Count gathered index values and a set of gathered $Values, then scatters the $VId_Count $Values into a new hierarchy flow with $max_count entries and each value at its respective index. An optional forth 0/1 argument denotes whether you want Scattered( ) to also return a sparse $VId_Mask bitmask, in which case Scattered( ) returns a list of two items, with the second being the VId_Mask. |
| Scattered_Indexes | $Indexes->Scattered_Indexes( $VId_Count, $max_count ) | ($max_count*log2($max_count), $max_count ) | Equivalent to $Indexes->Scattered ($Indexes, $VId_Count, $max_count) |
| Gathered | $VId_Mask->Gathered( $Values ) | ($VId_Mask->width( )*$Values->{0}->width( ), value_bitwidth($VId_Mask->width( )) | Takes a bitmask of valid values $VId_Mask (can also be a hierarchy flow with 1-bit leaves) and some scattered $Values, then returns two values in a list: 1) the valid $Values with corresponding bits set in the $VId_Mask all collapsed down (i.e., the first valid value occupies index 0, etc), and 2) a count of the number of bits set in $VId_Mask. Gathered( ) uses Tree( ) below. |
| Gathered_Indexes | $VId_Mask->Gathered_Indexes( ) | ($VId_Mask->width( )*log2($VId_Mask->width( )), value_bitwidth($VId_Mask->width( )) | Equivalent to passing the indexes 0, 1, 2, etc. as the $Values in $VId_Mask->Gathered($Values) |
| Scattered_Index | $VId_Mask->Scattered_Index( $G_Index ) | log2($VId_Mask->width( )) | Given a valid mask and a gathered index, returns the scattered index corresponding to that gathered index. |

TABLE 1-continued

| Op | Example | Out Width | Description |
|---|---|---|---|
| Gathered_Index | $VId_Mask->Gathered_Index( $S_Index ) | log2($VId_Mask->width( )) | Given a valid mask and a scattered index (whose bit must be set in $VId_Mask), returns the gathered index corresponding to that scattered index. In other words, it returns the number of ones in the $VId_Mask to the right of bit position $S_Index. |
| Tree | $Expr0->Tree( $callback ) | user-defined | |
| ?: | $Sel ? $Expr1 : $Expr0 | max(width0, $width1) | conditional |

Further, in one embodiment, the compute construct may be incorporated into the integrated circuit design in association with the one or more data flows. In one embodiment, the one or more data flows may be passed into the compute construct, where they may be checked at each stage. In another embodiment, errors may be immediately found and the design script may be killed immediately upon finding an error. In this way, a user may avoid reviewing a large amount of propagated errors. In yet another embodiment, the compute construct may check that each input data flow is an output data flow from some other construct or is what is called a deferred output.

For example, a deferred output may include an indication that a data flow is a primary design input or a data flow will be connected later to the output of some future construct. In another embodiment, it may be confirmed that each input data flow is an input to no other constructs. In yet another embodiment, each construct may create one or more output data flows that may then become the inputs to other constructs. In this way, the concept of correctness-by-construction may be promoted. In still another embodiment, the constructs may be superflow-aware. For example, some constructs may expect superflows, and others may perform an implicit 'for' loop on the superflow's subflows so that the user doesn't have to.

Furthermore, in one embodiment, a set of introspection methods may be provided that may allow user designs and generators to interrogate data flows. For example, the compute construct may use these introspection functions to perform their work. More specifically, the introspection methods may enable obtaining a list of field names within a hierarchical data flow, widths of various subflows, etc. In another embodiment, in response to the introspection methods, values may be returned in forms that are easy to manipulate by the scripting language.

Further still, in one embodiment, the compute construct may include constructs that are built in to the hardware description language and that perform various data steering and storage operations that have to be built into the language. In another embodiment, the constructs may be bug-free (verified) as an incentive for the user to utilize them as much as possible.

Also, in one embodiment, the compute construct may contain one or more parameters. For example, the compute construct may contain a "name" parameter that indicates abuse module name that will be used for the compute construct and which shows up in the debugger. In another embodiment, the compute construct may contain a "comment" parameter that provides a textual comment that shows up in the debugger. In yet another embodiment, the compute construct may contain a parameter that corresponds to an interface protocol. In one embodiment, the interface protocol may include a communications protocol associated with a particular interface. In another embodiment, the communications protocol may include one or more formats for communicating data utilizing the interface, one or more rules for communicating data utilizing the interface, a syntax used when communicating data utilizing the interface, semantics used when communicating data utilizing the interface, synchronization methods used when communicating data utilizing the interface, etc. In one example, the compute construct may include a "stallable" parameter that indicates whether automatic data flow control is to be performed within the construct (e.g., whether input data flows are to be automatically stalled when outputs aren't ready, etc.). For example, if the "stallable" parameter is 0, the user may use various data flow methods such as Valid( ) and Ready( ), as well as a Stall statement to perform manual data flow control.

Additionally, in one embodiment, the compute construct may contain an out_fifo parameter that allows the user to specify a depth of the output FIFO for each output data flow. For example, when multiple output data flows are present, the user may supply one depth that is used by all, or an array of per-output-flow depths. In another embodiment, the compute construct may contain an out_reg parameter that causes the output data flow to be registered out. For example, the out_reg parameter may take a 0 or 1 value or an array of such like out_fifo.

Further, in one embodiment, the compute construct may contain an out_rdy_reg parameter that causes the output data flow's implicit ready signal to be registered in. This may also lay down an implicit skid flip-flop before the out_reg if the latter is present. In another embodiment, out_fifo, out_reg, and out_rdy_reg may be mutually exclusive and may be used in any combination.

Further still, in one embodiment, clocking and clock gating may be handled implicitly by the compute construct. For example, there may be three levels of clock gating that may be generated automatically: fine-grain clock gating (FGCG), second-level module clock gating (SLCG), and block-level design clock gating (BLCG). In another embodiment, FGCG may be handled by synthesis tools. In yet another embodiment, a per-construct (i.e., per-module) status may be maintained. In still another embodiment, when the status is IDLE or STALLED, all the flip-flops and rams in that module may be gated. In another embodiment, the statuses from all the constructs may be combined to form the design-level status that is used for the BLCG. This may be performed automatically, though the user may override the status value for any Compute( ) construct using the Status <value> statement.

Also, in one embodiment, a control construct may be incorporated into the integrated circuit design in association with the compute construct and the one or more data flows. For example, an output data flow from the control construct may act as an input data flow to the compute construct, or an output data flow from the compute construct may act as an input data flow to the control construct. See, for example, U.S. patent application Ser. No.13/844,330, filed Mar. 15, 2013, which is hereby incorporated by reference in its entirety, and which describes exemplary compute constructs.

Figure 3:
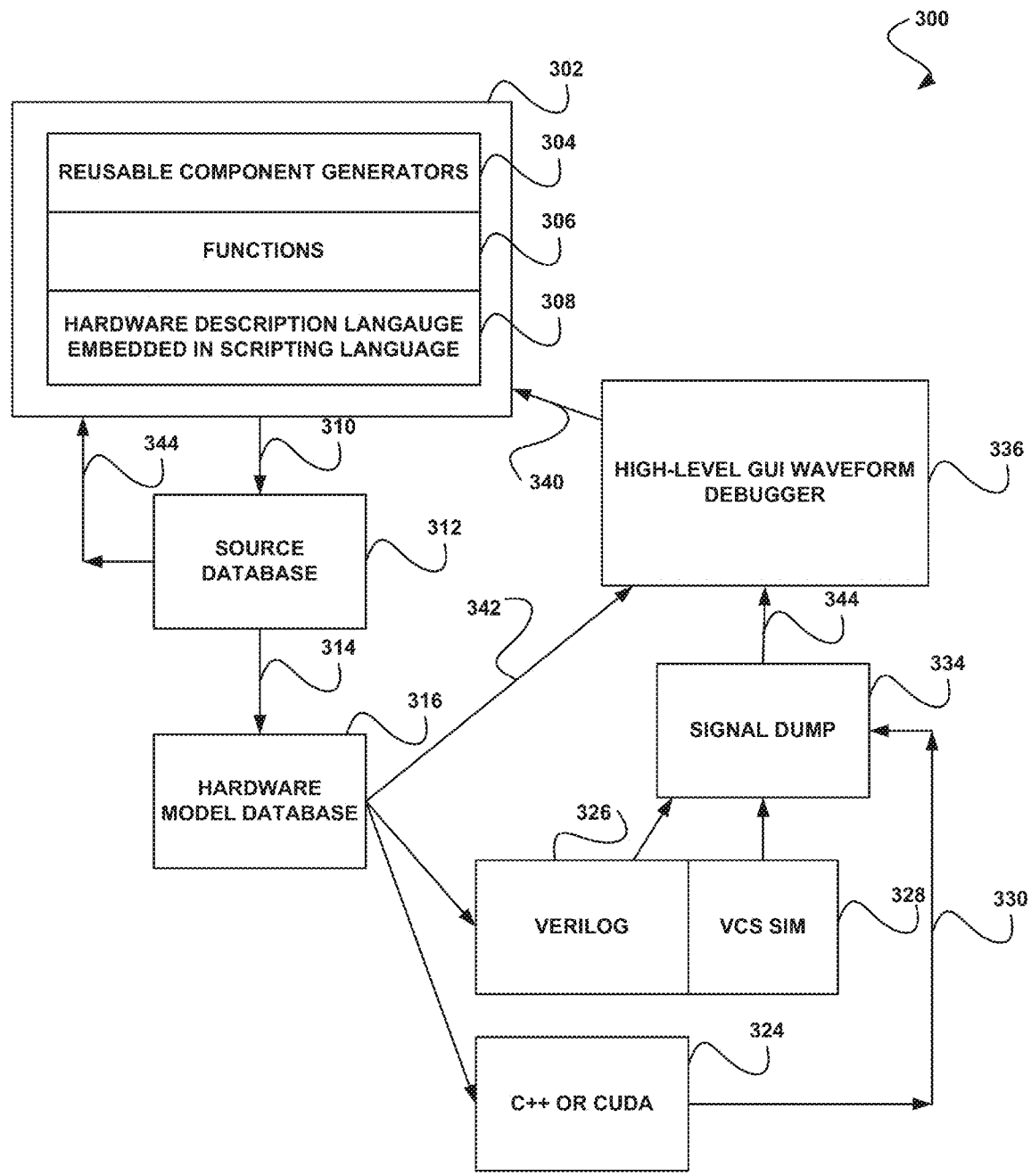
FIG. 3 shows an exemplary hardware design environment, in accordance with one embodiment.

FIG. 3 shows an exemplary hardware design environment 300, in accordance with one embodiment. As an option, the environment 300 may be carried out in the context of the functionality of FIGS. 1-2. Of course, however, the environment 300 may be implemented in any desired environment. It should also be noted that the aforementioned definitions may apply during the present description.

As shown, within a design module 302, reusable component generators 304, functions 306, and a hardware description language embedded in a scripting language 308 are all used to construct a design that is run and stored 310 at a source database 312. Also, any build errors within the design are corrected 344, and the design module 302 is updated. Additionally, the system backend is run on the constructed design 314 as the design is transferred from the source database 312 to a hardware model database 316.

Additionally, the design in the hardware model database 316 is translated into C++ or CUDA™ 324, translated into Verilog® 326, or sent directly to the hardware model database 336. If the design is translated into C++ or CUDA™ 324, the translated design 330 is provided to a signal dump 334 and then to a high level debugger 336. If the design is translated into Verilog® 326, the translated design is provided to the signal dump 334 or a VCS simulation 328 is run on the translated design, which is then provided to the signal dump 334 and then to the high level GUI (graphical user interface) waveform debugger 336. Any logic bugs found using the high level GUI waveform debugger 336 can then be corrected 340 utilizing the design module 302.

Figure 4:
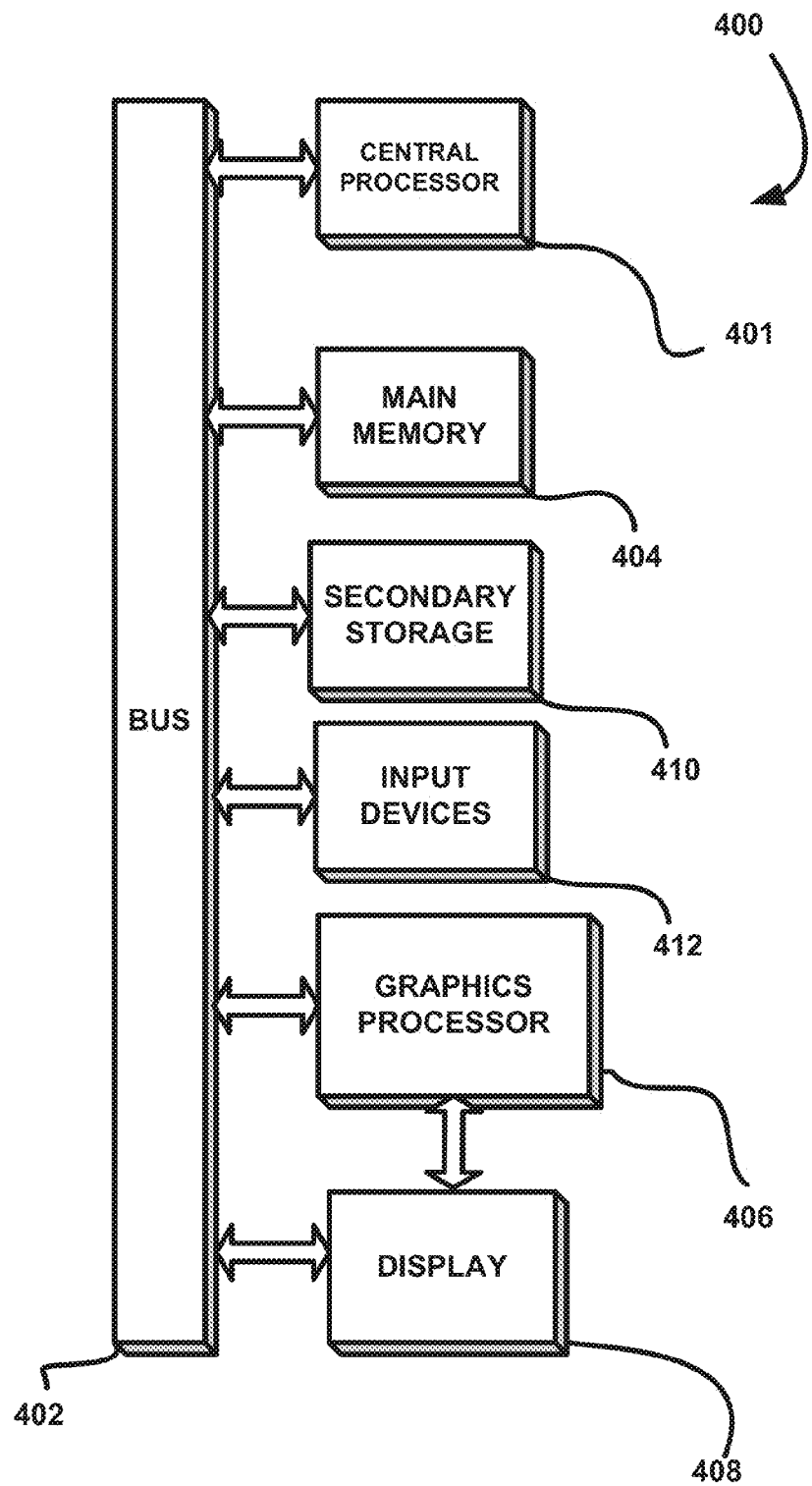
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The communication bus 402 may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM).

The system 400 also includes input devices 412, a graphics processor 406 and a display 408, i.e. a conventional CRT (cathode ray tube), LCD (liquid crystal display), LED (light emitting diode), plasma display or the like. User input may be received from the input devices 412, e.g., keyboard, mouse, touchpad, microphone, and the like. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The system may also be realized by reconfigurable logic which may include (but is not restricted to) field programmable gate arrays (FPGAs).

The system 400 may also include a secondary storage 410. The secondary storage 410 includes, for example, a hard disk drive and/or a removable storage drive, representing a floppy disk drive, a magnetic tape drive, a compact disk drive, digital versatile disk (DVD) drive, recording device, universal serial bus (USB) flash memory, etc. The removable storage drive reads from and/or writes to a removable storage unit in a well-known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices m including, but not limited to a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:
1. A method, comprising:
identifying, by a processor, a callback function and a plurality of data values corresponding to signals of a hardware design;
providing the plurality of data values and the callback function to a compute construct, wherein the compute construct is configured to check that an unconnected data flow is indicated as a deferred data flow and comprises a first parameter configured to perform control of data flow through the hardware design by automatically stalling an input data flow within the compute construct; and executing, by the processor, the compute construct to recursively apply the callback function to the plurality of data values in order to determine a result.

2. The method of claim 1, wherein the plurality of data values include subflows within a numerical hierarchy data flow.

3. The method of claim 1, wherein applying the callback function to the plurality of data values includes performing a reduction operation on the plurality of data values.

4. The method of claim 1, wherein applying the callback function to the plurality of data values includes identifying the each of the plurality of data values as leaf nodes of a tree-based data structure.

5. The method of claim 4, wherein consecutive rounds of comparisons are performed by the callback function at each level of the tree-based structure until a single output is produced for a particular round of comparisons.

6. The method of claim 1, wherein applying the callback function to the plurality of data values includes performing a first round of comparisons.

7. The method of claim 6, wherein performing the first round of comparisons results in one or more outputs.

8. The method of claim 6, wherein the first round of comparisons are performed at a first level of a tree-based data structure.

9. The method of claim 1, wherein applying the callback function to the plurality of data values includes performing a second round of comparisons.

10. The method of claim 1, wherein applying the callback function to the plurality of data values is performed by a tree function included within the compute construct.

11. The method of claim 10, wherein the tree function is utilized by one or more of a Min( )function that returns a minimum value from a hierarchical data flow with multiple numerically named subflows and a Max( )function that returns a maximum value from a hierarchical data flow with multiple numerically named subflows.

12. The method of claim 10, wherein the tree function is utilized by one or more of a Prio_Min( )function that returns a minimum priority value from a numerical hierarchy data flow containing priority values and a Prio_Max( )function that returns a maximum priority value from a numerical hierarchy data flow containing priority values.

13. The method of claim 1, wherein the tree function is utilized by a scatter-gather function.

14. The method of claim 1, wherein the callback function represents a combinational circuit function configured to operate on the input data flow.

15. The method of claim 1, wherein the compute construct further comprises a second parameter that is configured to perform control a depth of an output first-in first-out buffer for each output data flow.

16. The method of claim 1, wherein the compute construct further comprises a second parameter that is configured to register an output data flow.

17. The method of claim 1, wherein the compute construct further comprises a second parameter that is configured to register a ready signal of an output data flow.

18. A computer program product embodied on a non-transitory computer readable medium, comprising:
code for identifying a callback function and a plurality of data values corresponding to signals of a hardware design;
code for providing the plurality of data values and the callback function to a compute construct, wherein the compute construct is configured to check that an unconnected data flow is indicated as a deferred data flow and comprises a first parameter configured to perform control of data flow through the hardware design by automatically stalling an input data flow within the compute construct; and
code for recursively applying the callback function to the plurality of data values in order to determine a result.

19. A system, comprising:
a processor configured to:
identify a callback function and a plurality of data values corresponding to signals of a hardware design,
provide the plurality of data values and the callback function to a compute construct, wherein the compute construct is configured to check that an unconnected data flow is indicated as a deferred data flow and comprises a first parameter configured to perform control of data flow through the hardware design by automatically stalling an input data flow within the compute construct; and
execute the compute construct to recursively apply the callback function to the plurality of data values in order to determine a result.

* * * * *